(12) United States Patent
Jeong et al.

(10) Patent No.: US 7,306,971 B2
(45) Date of Patent: Dec. 11, 2007

(54) SEMICONDUCTOR CHIP PACKAGING METHOD WITH INDIVIDUALLY PLACED FILM ADHESIVE PIECES

(75) Inventors: Jin-Wook Jeong, Ichon-si (KR); In-Sang Yoon, Ichon-si (KR); Hee Bong Lee, Ichon-si (KR); Hyun-Joon Oh, Austin, TX (US); Hyeog Chan Kwon, Seoul (KR); Jong Wook Ju, Kyoungnam (KR); Sang Ho Lee, Kyonggi (KR)

(73) Assignee: Chippac Inc., Fremont, CA (US)

( * ) Notice: Subject to any disclaimer, the term of this patent is extended or adjusted under 35 U.S.C. 154(b) by 0 days.

(21) Appl. No.: 10/976,601

(22) Filed: Oct. 29, 2004

(65) Prior Publication Data

US 2005/0208701 A1 Sep. 22, 2005

Related U.S. Application Data

(60) Provisional application No. 60/549,174, filed on Mar. 2, 2004.

(51) Int. Cl.
*H01L 21/44* (2006.01)

(52) U.S. Cl. ............... 438/106; 438/107; 438/109; 438/110; 438/112; 438/113; 438/118; 257/E21.503; 257/E21.505

(58) Field of Classification Search ................ 438/110
See application file for complete search history.

(56) References Cited

U.S. PATENT DOCUMENTS

| | | | |
|---|---|---|---|
| 5,140,404 A | 8/1992 | Fogal et al. | |
| 5,218,229 A | 6/1993 | Farnworth | |
| 5,323,060 A | 6/1994 | Fogal et al. | |
| 5,372,883 A | 12/1994 | Shores | |
| 5,776,799 A | 7/1998 | Song et al. | |
| 5,918,113 A * | 6/1999 | Higashi et al. | 438/119 |
| 5,945,733 A | 8/1999 | Corbett et al. | |
| 6,265,763 B1 | 7/2001 | Jao et al. | |
| 6,333,562 B1 | 12/2001 | Lin | |
| 6,340,846 B1 | 1/2002 | LoBianco et al. | |
| 6,351,028 B1 | 2/2002 | Akram | |
| 6,388,313 B1 | 5/2002 | Lee et al. | |
| 6,436,732 B2 | 8/2002 | Ahmad | |
| 6,441,496 B1 | 8/2002 | Chen et al. | |
| 6,472,758 B1 | 10/2002 | Glenn et al. | |

(Continued)

OTHER PUBLICATIONS

Lintec Semiconductor-Related Products Web Site, "Adwill Semiconductor-Related Products", 1 page, http://www.lintec.co.jp/e-dept/english/adwill/adwill.html, downloaded Mar. 1, 2004.

(Continued)

*Primary Examiner*—Michael Lebentritt
*Assistant Examiner*—Kyoung Lee

(57) ABSTRACT

Individual pieces of film adhesive (42) are placed on a support surface (46). Diced semiconductor chips (24) are individually placed on the individual pieces of the film adhesive thereby securing the diced semiconductor chips to the support surface to create first chip subassemblies (52). The diced semiconductor chip and support surface of each of a plurality of the first chip subassemblies are electrically connected, such as by wires (54), to create second chip subassemblies ((56). At least a portion of at least some of the second chip subassemblies are encapsulated, such as with molding compound (58), to create semiconductor chip packages (60).

4 Claims, 10 Drawing Sheets

U.S. PATENT DOCUMENTS

| | | | |
|---|---|---|---|
| 6,503,821 B2 | 1/2003 | Farquhar et al. | |
| 6,569,709 B2 | 5/2003 | Derderian | |
| 6,593,662 B1 * | 7/2003 | Pu et al. | 257/777 |
| 6,620,651 B2 | 9/2003 | He et al. | |
| 6,650,009 B2 | 11/2003 | Her et al. | |
| 6,885,093 B2 | 4/2005 | Lo et al. | |
| 7,115,484 B2 | 10/2006 | Feng | |
| 2002/0064905 A1 * | 5/2002 | Park et al. | 438/109 |
| 2003/0030132 A1 * | 2/2003 | Lee et al. | 257/678 |
| 2003/0038357 A1 | 2/2003 | Derderian | |
| 2003/0038374 A1 | 2/2003 | Shim et al. | |
| 2003/0178710 A1 | 9/2003 | Kang et al. | |
| 2004/0026768 A1 | 2/2004 | Taar et al. | |
| 2004/0087054 A1 * | 5/2004 | Abe | 438/460 |
| 2004/0097054 A1 * | 5/2004 | Abe | 438/460 |
| 2005/0090050 A1 | 4/2005 | Shim et al. | |
| 2005/0208700 A1 * | 9/2005 | Kwon et al. | 438/106 |

OTHER PUBLICATIONS

Lintec Semiconductor-Related Products Web Site, "Products for Dicing Process", 2 pages, http://www.lintec.co.jp/e-dept/english/adwill/diceproces.html, downloaded Mar. 1, 2004.

Lintec Semiconductor-Related Products Web Site, "Products for back-grinding process", 1 page, http://www.lintec.co.jp/e-dept/english/adwill/bgproces.html, Downloaded Mar. 1, 2004.

* cited by examiner

SEMICONDUCTOR CHIP PACKAGING METHOD WITH INDIVIDUALLY PLACED FILM ADHESIVE PIECES

CROSS-REFERENCE TO RELATED APPLICATIONS

This application claims priority from U.S. Provisional Application No. 60/549,174, filed Mar. 2, 2004, titled "Method for manufacturing stacked chip package using film adhesive".

BACKGROUND

The present invention relates to a film adhesive and bonding method used in the fabrication of semiconductor packages, especially multi-chip modules, and more particularly to the manufacturing method of such packages.

To obtain the maximum function and efficiency from the minimum package, various types of increased density packages have been developed. Among these various types of packages is the so-called multi-chip module, multi-chip package or stacked chip package. A multi-chip module includes one or more integrated semiconductor chips stacked one onto another to provide the advantages of light weight, high density, and enhanced electrical performance.

Semiconductor chip packaging process typically begins with wafer dicing, that is sawing a semiconductor wafer to separate the wafer into individual semiconductor devices or chips. Before sawing, a wafer mounting tape is typically attached to the backside of the wafer. The wafer mounting tape keeps the chips together after the sawing.

The semiconductor chip is typically adhered to a previously mounted chip or to the substrate with a paste (typically an epoxy paste adhesive) or a film adhesive. Generally, paste adhesives have been used more often than film adhesives. However, some multi-chip modules are more successfully fabricated using film adhesives because the thickness of adhesive film is uniform so that there is minimal or no tilt of the semiconductor chips and no fillet of adhesive encircling the semiconductor chip. Moreover, no resin is bled so that it is suitable for multi chip stacking and packages with tight design tolerances or thinner chips.

In one method of fabricating a multi-chip module using film adhesive, an adhesive film is laminated directly to the backside of the semiconductor wafer and then the wafer is diced into individual semiconductor chips using conventional wafer dicing equipment. For stacking the semiconductor chips, each chip is lifted by a chip-bonding tool, which is usually mounted at the end of a pick-and-place device, and mounted onto the substrate or onto a semiconductor chip mounted previously. This method requires special film laminating equipment. However, it can shorten fabrication time and lower cost because the paste-dispensing process is not needed.

After the chip mounting process, bonding pads of the chips are connected to bonding pads of the substrate with Au or Al wires during a wire bonding process to create an array of semiconductor chip devices. Finally, the semiconductor chips and their associated wires connected to the substrate are encapsulated, typically using an epoxy-molding compound, to create an array of encapsulated semiconductor devices. The molding compound protects the semiconductor devices from the external environment, such as physical shock and humidity. After encapsulation, the encapsulated devices are separated, typically using a laser saw, into individual semiconductor chip packages.

SUMMARY

A first aspect of the present invention is directed to a first semiconductor chip packaging method. Individual pieces of film adhesive are placed on a support surface. Diced semiconductor chips are individually placed on the individual pieces of the film adhesive thereby securing the diced semiconductor chips to the support surface to create first chip subassemblies. The diced semiconductor chip and support surface of each of a plurality of the first chip subassemblies are electrically connected to create second chip subassemblies. At least a portion of at least some of the second chip subassemblies are encapsulated to create semiconductor chip packages. The method may also comprise selecting diced semiconductor chips having an adhesive layer on a backside thereof; and the individually placing step may also comprise placing the diced semiconductor chips on the individual pieces of the film adhesive with the adhesive layer contacting the film adhesive. The adhesive layer may comprise a dielectric film adhesive layer. The film adhesive placing step may be carried out with the individual pieces of film adhesive being placed directly on a previously-placed diced semiconductor chip and thereby indirectly on the support surface. The film adhesive placing step may also be carried out with the individual pieces of film adhesive being placed directly on a previously-placed diced semiconductor spacer chip and thereby indirectly on the support surface. The method may also include individually placing second diced semiconductor chips, having a dielectric adhesive on a side thereof, on at least some of the diced semiconductor chips of the first chip subassemblies, and adhering the second diced semiconductor chips to the at least some of the diced semiconductor chips of the first chip subassemblies using the dielectric adhesive on the second diced semiconductor chips.

A second aspect of the invention is directed to a second semiconductor chip packaging method. First individual pieces of film adhesive are placed directly on a support surface. First diced semiconductor chips are individually placed on the first individual pieces of film adhesive thereby securing the first diced semiconductor chips directly to the support surface to create first chip subassemblies. Individual pieces of film adhesive are placed on the first diced semiconductor chips of the first chip subassemblies. A second diced semiconductor chip is individually placed on at least some of the second individual pieces of film adhesive thereby securing the second diced semiconductor chips to the first chip subassemblies to create multiple-layer second chip subassemblies. The first diced semiconductor chips and support surface of a plurality of the multiple-layer second chip subassemblies are electrically connected to create multiple-layer third chip subassemblies. A portion of at least some of the multiple-layer third chip subassemblies are encapsulated to create semiconductor chip packages.

Various features and advantages of the invention will appear from the following description in which the preferred embodiments have been set forth in detail in conjunction with the accompanying drawings.

BRIEF DESCRIPTION OF THE DRAWINGS

FIG. 1 is a flowchart of a conventional semiconductor packaging process in which a paste is used as the semiconductor chip-bonding adhesive;

FIG. 2 is a simplified view illustrating the wafer mounting tape lamination step of FIG. 1;

FIG. 3 is a simplified illustration of the result of the wafer dicing step of FIG. 1;

FIG. 4 illustrates a conventional diced semiconductor chip, or die, made according to the method of FIG. 1;

FIG. 13 illustrates a further conventional semiconductor chip packaging process, which can be used in conjunction with the process of FIG. 5, in which the diced semiconductor chip has a film adhesive on the ground backside of the diced semiconductor chip;

FIG. 14 illustrates the wafer backside grinding step of FIG. 13;

FIG. 15 is a simplified cross sectional view of the wafer mounting tape including a dicing tape layer and a film adhesive layer, the film adhesive layer positioned between the dicing tape layer and a removable cover film;

FIG. 16 illustrates mounting the ground backside of the semiconductor wafer of FIG. 14 to the film adhesive layer of the tape of FIG. 15;

FIG. 17 is a simplified cross sectional view illustrating the wafer mounting tape adhered to the ground wafer of FIG. 16;

FIG. 18 illustrates the wafer dicing step of FIG. 13;

FIG. 19 is a simplified view illustrating two diced semiconductor chips separated by a groove formed during the wafer dicing step, the groove extending part way into the dicing tape layer;

FIG. 20 illustrates mounting the semiconductor chip with adhesive layer of FIG. 19 onto a substrate, the substrate supported by a heater block;

FIG. 21 illustrates a single semiconductor chip after the wire bonding step of FIG. 13;

FIG. 22 illustrates a semiconductor chip package similar to that of FIG. 10;

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1:
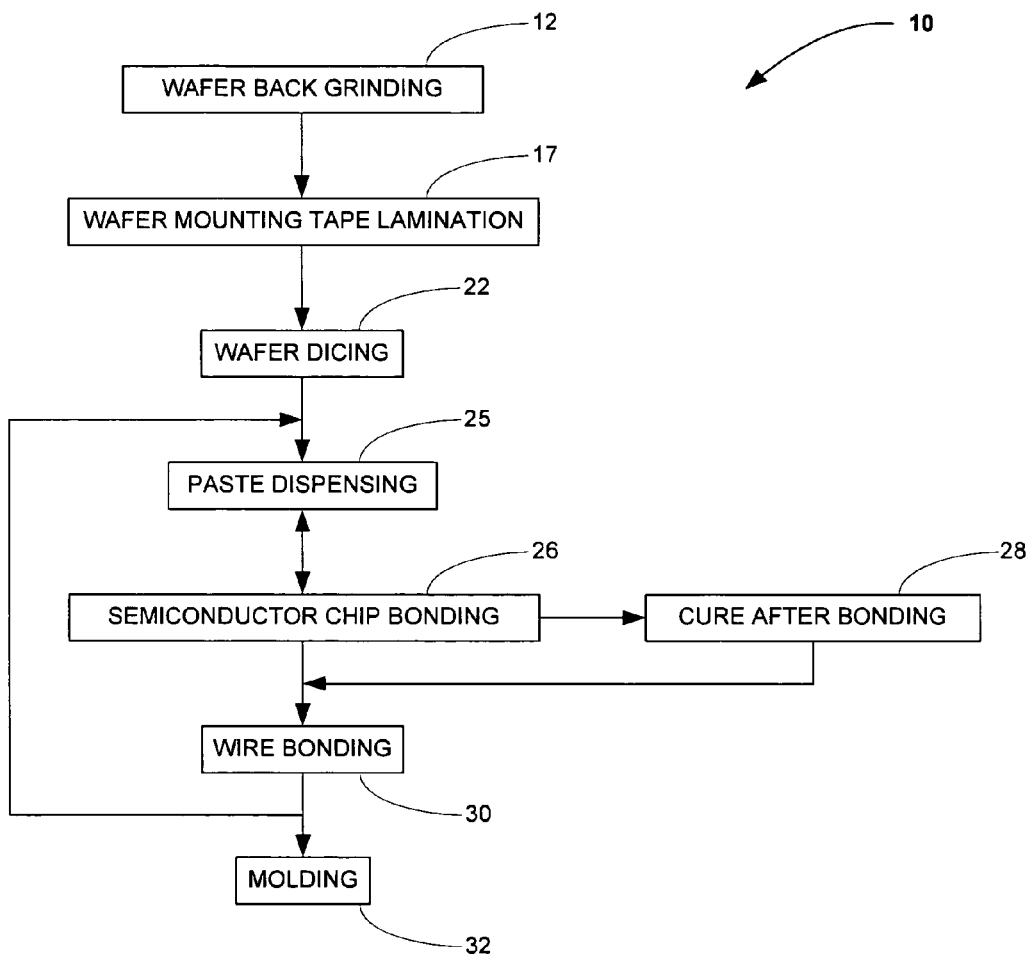
FIGS. 1-4 and 13-22 are conventional.
Figure 2:
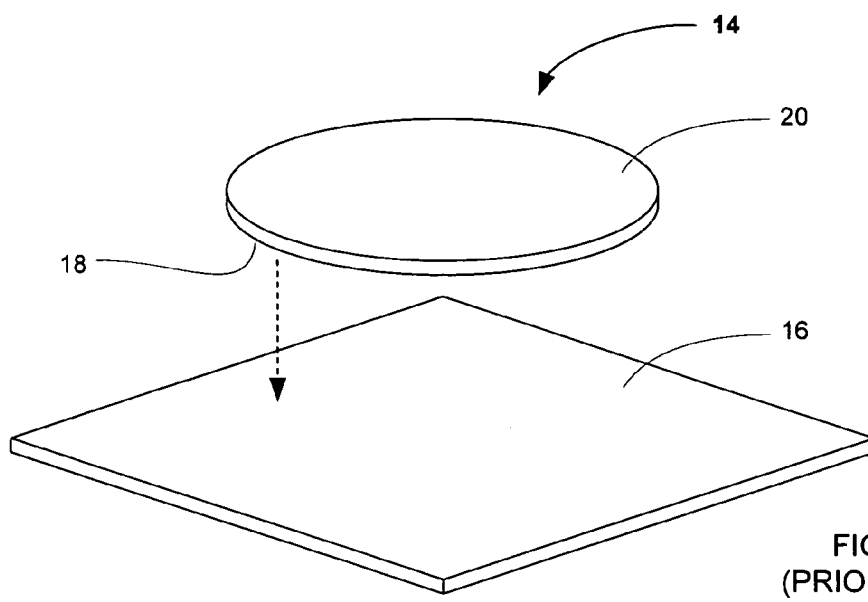
Figure 3:
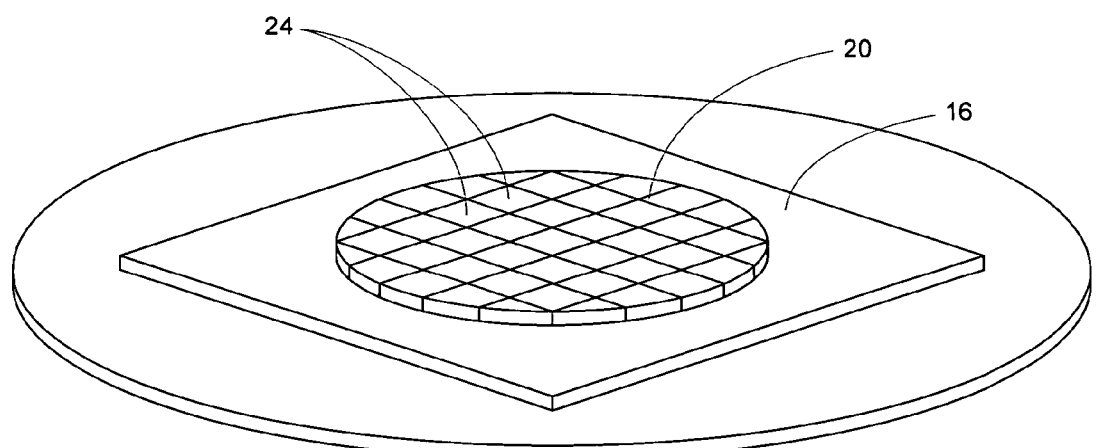
Figure 4:
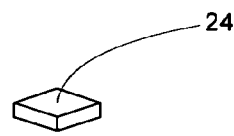

FIGS. 1-4 illustrate a conventional semiconductor packaging process 10 in which a wafer, not shown, is subjected to a wafer back grinding step 12 during which material is removed from the back or non-circuit side of the wafer. The back-ground wafer 14, see FIG. 2, is then laminated to a wafer mounting tape 16 during a wafer mounting tape lamination step 17 with the second, back-ground side 18 (also called backside 18) being adhered to the wafer mounting tape so that the first side 20 (circuit side 20) of background wafer 14 is exposed. The wafer-dicing step 22 is carried out to create diced semiconductor chips 24, also called die 24. Die 24 are bonded to a substrate using a paste adhesive pursuant to the paste dispensing step 25, semiconductor chip bonding step 26 and cure after bonding step 28 of FIG. 1. Thereafter the wire-bonding step 30 is carried out. For a stacked-die device, steps 25-30 may be repeated according to the number of layers of chips in the completed device. After the molding step 32, which is typically carried out using a molding compound, appropriate sawing or other severing equipment is used to cut through the substrate and, when the entire substrate is covered with molding compound, the molding compound to create the individual semiconductor chip packages. It should be noted that a residue of wafer mounting tape 16 can adhere to backside 18 of die 24 after the die has been removed from the wafer mounting tape; however, such remaining adhesive is not sufficient to create an effective bond between die 24 and the substrate, so that the paste adhesive is needed.

Figure 5:
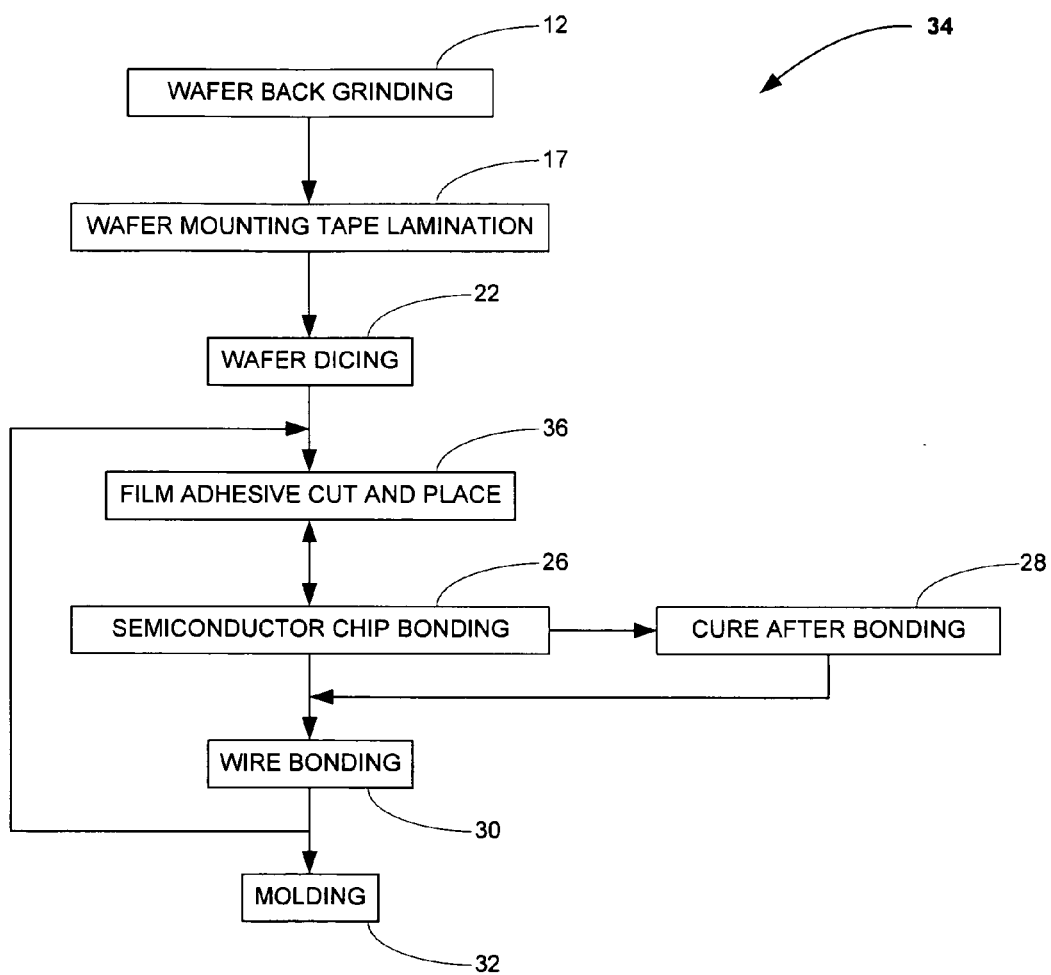
FIG. 5 is a flowchart of a semiconductor packaging process according to the invention, the process being similar to that of FIG. 1 but a film adhesive cut and place step replaces the paste dispensing step.

FIG. 5 is a flowchart of a semiconductor packaging process 34 according to the present invention. Process 34 is similar to process 10 of FIG. 1; the main distinction is that a film adhesive cut and place step 36 replaces paste-dispensing step 24 of FIG. 1. Like steps and elements will be referred to with like reference numerals.

Figure 6:
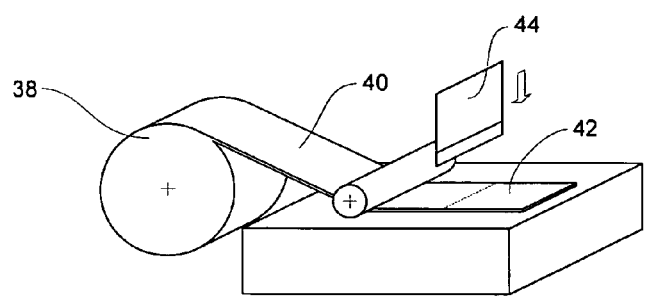
FIG. 6 illustrates creating individual pieces of film adhesive from a roll of film adhesive.
Figure 7:
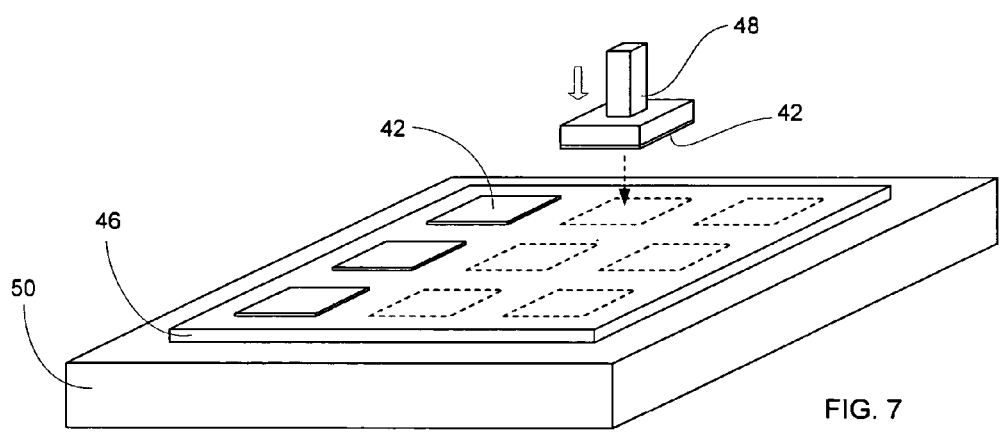
FIG. 7 illustrates the pick and place process by which the individual pieces of film adhesive are placed on the substrate by a suitable tool.
Figure 8:
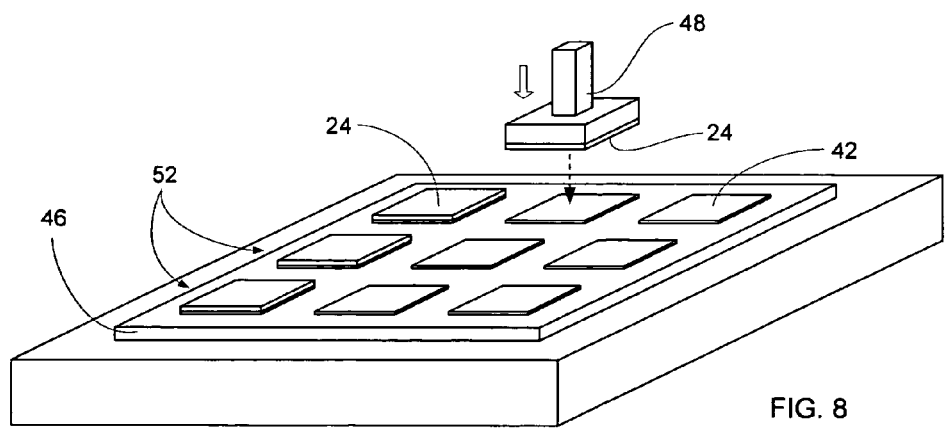
FIG. 8 illustrates placing the individual diced semiconductor chips onto the previously placed individual pieces of film adhesive using a tool to create first chip subassemblies.
Figure 9:
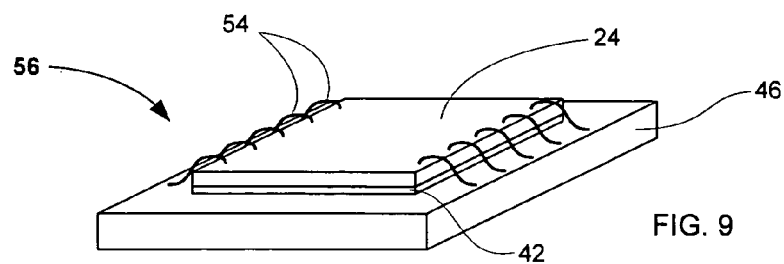
FIG. 9 shows the results of the wire bonding step of FIG. 5 creating a second chip subassembly.
Figure 10:
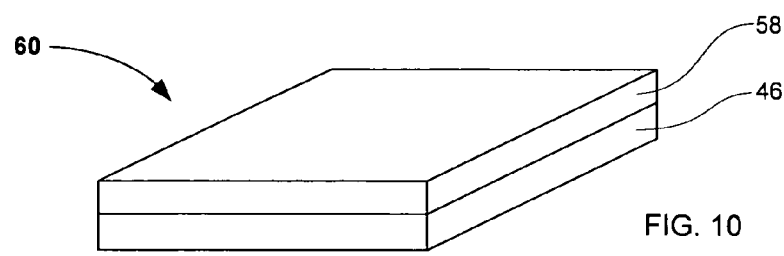
FIG. 10 illustrates the results of the molding step of FIG. 5 and after the individual semiconductor chip packages have been separated from one another.

FIG. 6 illustrates a roll 38 of continuous film adhesive 40 being separated into individual pieces of film adhesive 42 by a cutter 44. Film adhesive 42 is preferably a dielectric film adhesive. Film adhesive 42 may be a conventional dielectric film adhesive, such as available from Lintec Corporation as Lintec LE5000. FIG. 7 illustrates placing individual pieces of film adhesive 42 at spaced-apart locations on a substrate 46 by a conventional die bonding tool 48. Substrate 46 is mounted on a heater block 50 when it is desired to heat the components during the manufacturing process. FIG. 8 illustrates the use of tool 48 to mount die 24 onto the previously placed film adhesive 42 to create first chip subassemblies 52. FIG. 9 illustrates a first chip subassembly 52 of FIG. 8 after wire-bonding step 30 has secured wires 54 between die 24 and substrate 46 to create a second chip subassembly 56. After molding step 32, appropriate sawing or severing equipment is used to cut through molding compound 58 and substrate 46 to create individual semiconductor chip packages 60, one of which is shown in FIG. 10.

Figure 11:
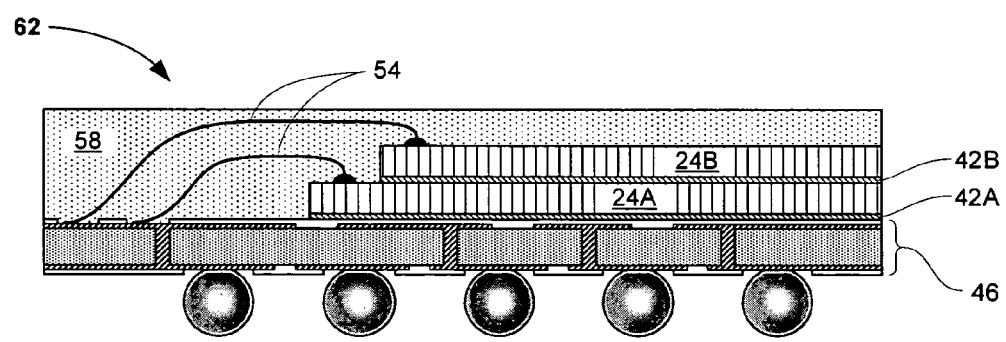
FIGS. 11 and 12 are partial cross sectional views of two semiconductor chip packages, each with multiple chips, made according to the invention.

FIG. 11 illustrates a portion of a semiconductor chip package 62 in which the film adhesive cut and place step 36 through the wire-bonding step 30 are repeated for both a first die 24A and a second, somewhat smaller, die 24B prior to molding step 32. That is, a first individual piece of film adhesive 42A is mounted onto a die attach region of the substrate 46, and then the first die 24A is mounted onto the adhesive 42A. Then, a second individual piece of film adhesive 42B is mounted onto a die attach region of the first die 24A, and then the second die 24B is mounted onto the adhesive 42B. The smaller size of adhesive film piece 42B and of die 24B provides the necessary room at the margin of active side of the first die 24A for bonding wires 54.

Figure 12:
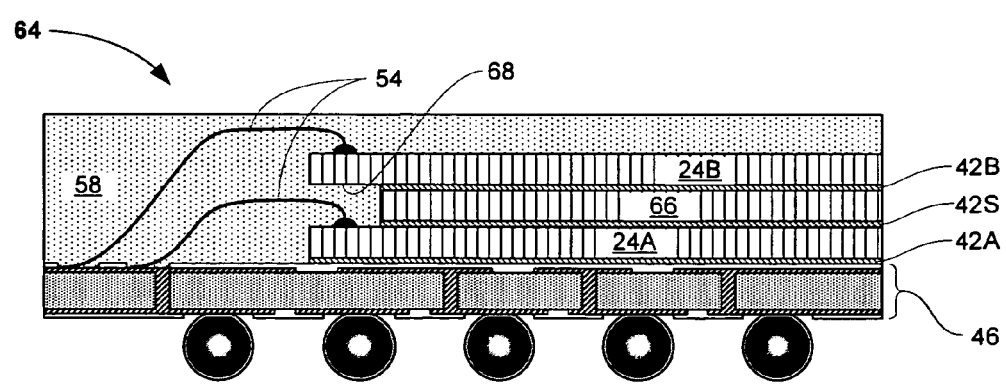

FIG. 12 illustrates a semiconductor chip package 64 in which first and second active die 24A and 24B are the same size. Therefore, in embodiments such as these, in order to accommodate bonding wires 54 onto die 24A, a spacer (typically, a "dummy" die) 66 is mounted to first die 24A in the same manner as second die 24B in FIG. 11, and then the second die 24B is mounted onto spacer 66 in a similar manner. That is, after the first die 24A has been attached onto the substrate 46, a piece of film adhesive 42S is mounted onto a die attach region of the first die 24, and then the spacer die 66 is mounted onto the adhesive 42S. A piece of film adhesive 42B is mounted onto spacer die 66, and then the second die 24B is mounted onto the adhesive 42B. Because the film adhesive 42B between second die 24B and spacer die 66 is dimensioned no larger than the upper surface of the spacer die 66, and does not cover an overhanging area 68 along the periphery of second die 24B, care must be taken to prevent electrical leakage between the overhanging area 68 and the wires 54 connecting to first semiconductor die 24A. Particularly, for example, the thickness of the spacer 66 together with the thicknesses of the adhesive films 42S and 42B may be made greater than the loop height of the wire bonds connecting the first die 24A to the substrate 46, to avoid contact or proximity between the wires and the overhang 68.

Figure 13:
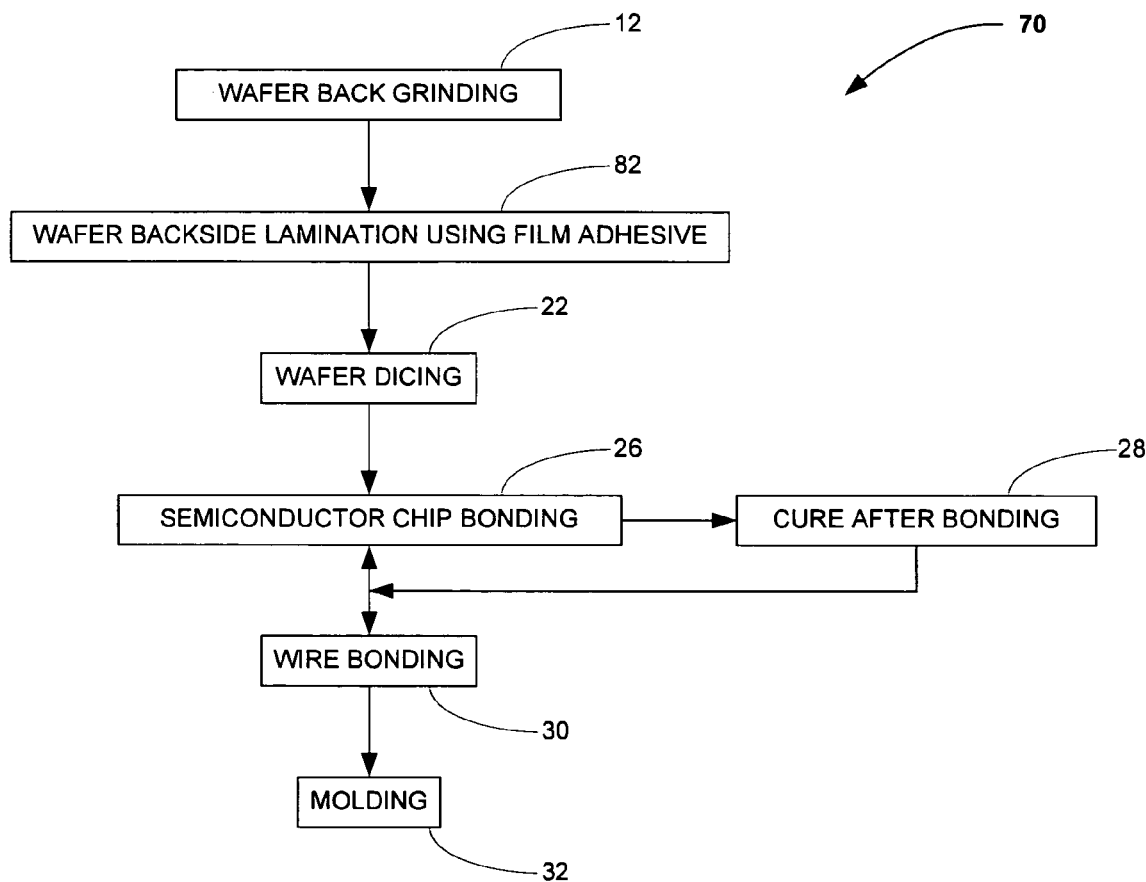
Figure 14:
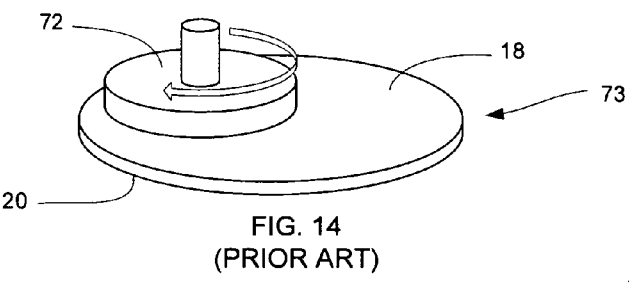
Figure 15:
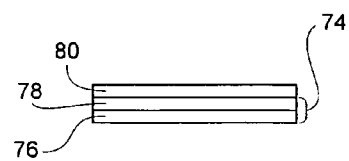
Figure 16:
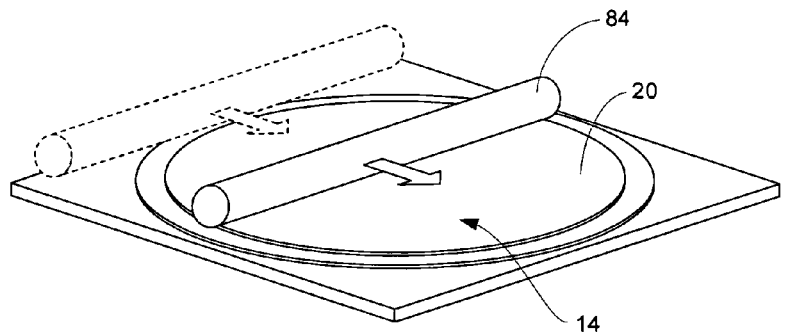
Figure 17:
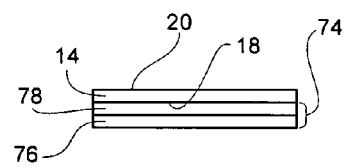
Figure 18:
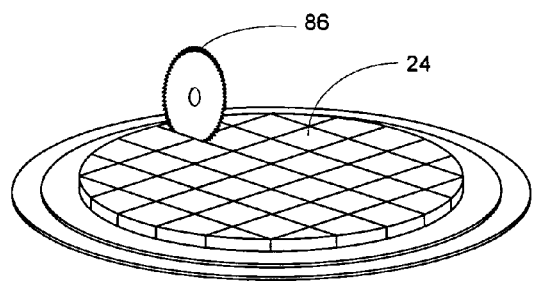
Figure 19:
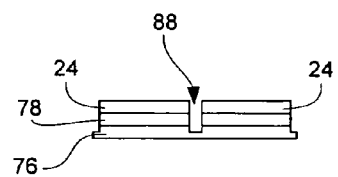
Figure 20:
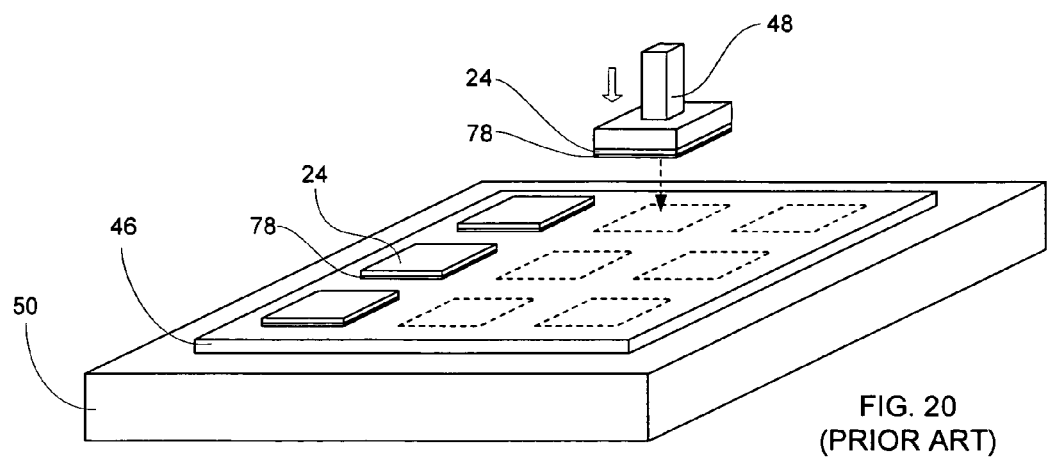
Figure 21:
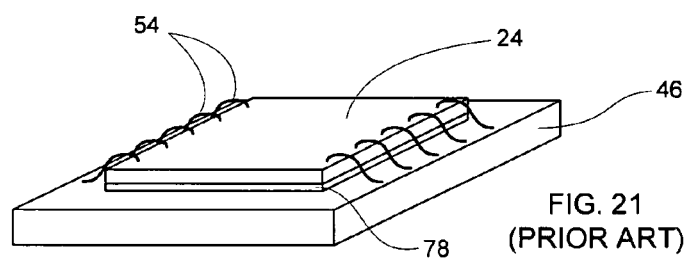
Figure 22:
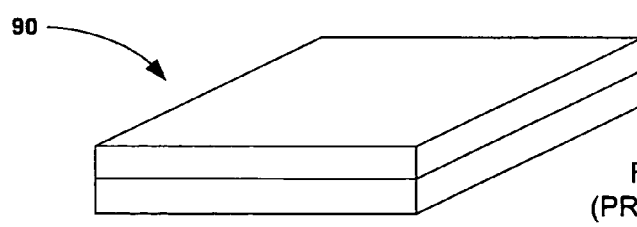

FIGS. 13-22 illustrate a further conventional semiconductor chip packaging process 70, which can be used in conjunction with process 34 of FIG. 5 as discussed below with reference to FIGS. 23-25. FIG. 14 illustrates a grinding wheel 72 removing material from the backside 18 of a wafer 73 during the wafer backside-grinding step 12 of FIG. 13. FIG. 15 is a simplified cross sectional view of a wafer mounting tape 74 including a dicing tape layer 76 and a film adhesive layer 78, the film adhesive layer positioned between the dicing tape layer and a removable cover film 80. Following wafer back grinding step 12, the second, background side 18 of ground wafer 14 is secured to film adhesive layer 78 of wafer mounting tape 74, the cover film 80 having been removed, in the lamination step 82 of FIG. 13. This is illustrated in FIG. 16 showing a roller 84 contacting first, circuit side 20 of ground wafer 14. Lamination step 82 is typically carried out at temperatures from about 20° C. to about 300° C. FIG. 17 is a simplified cross sectional view illustrating wafer mounting tape 74 adhered to backside 18 of ground wafer 14. FIG. 18 illustrates a sawing blade 86 creating individual die 24 during wafer dicing step 22. FIG. 19 is a simplified view illustrating two diced semiconductor chips 24 separated by a groove 88 formed during wafer dicing step 22. Groove 88 extends through film adhesive layer 78 and part way into dicing tape layer 76. FIG. 20 illustrates mounting a semiconductor chip 24 with film adhesive layer 78 onto substrate 46 using die bonding tool 48. Substrate 46 is supported by heater block 50. Film adhesive layer 78 is typically activated at temperatures between about 20° C. to about 300° C. In FIG. 21 wires 54 are shown connecting a single semiconductor chip 24 to substrate 46 after wire bonding step 30. An individual semiconductor chip package 90 is shown in FIG. 22 after molding step 32 and an appropriate sawing or other severing step.

Figure 23:
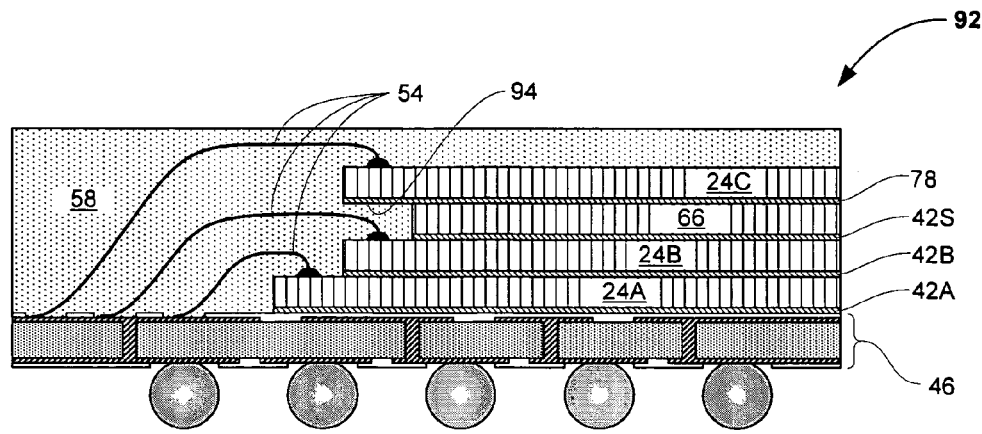
FIGS. 23 and 24 illustrate two additional multichip modules in which most of the chip layers have been created according to the method of FIGS. 5-8 while the uppermost chip layer has been created according to the method of FIGS. 13-20, the uppermost chip layer having a dielectric film adhesive on the backside thereof to provide adhesion and electrical insulation.

Semiconductor chip package 92, shown in FIG. 23, is a multichip module comprising first and second die 24A and 24B as in FIG. 11 but also including a spacer die 66, similar to that of FIG. 12, upon which a third die 24C with a dielectric film adhesive layer 78, similar to that shown in FIG. 20, is mounted. The use of dielectric film adhesive layer 78 provides an electrically insulated overhanging area 94 as opposed to the substantially uninsulated overhanging area 68 of FIG. 12. Semiconductor chip package 96 of FIG. 24 is similar to package 64 of FIG. 12 but uses die 24C and dielectric film adhesive layer 78, as in FIG. 23, instead of second die 24B and film adhesive 42. The structure likewise creates an insulated overhanging area 94 to electrically isolate wires 54 from die 24C.

Figure 25:
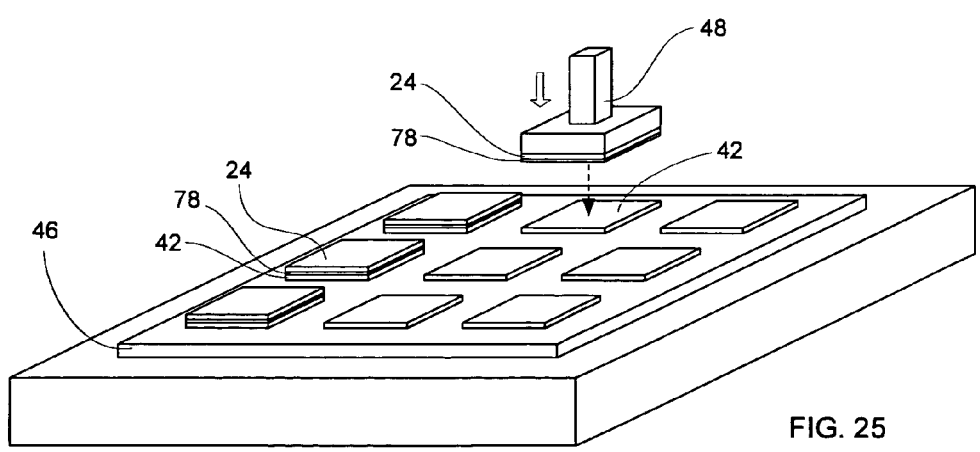
FIG. 25 illustrates a method effectively combining the processes of FIGS. 5 and 13 so that individual pieces of film adhesive are first placed on the substrate and then semiconductor chips having film adhesive on the backside thereof are then placed on the individual pieces of film adhesive.

FIG. 25 illustrates another structure created by effectively combining the processes of FIGS. 5 and 13. Individual pieces of film adhesive 42 are first placed on substrate 46, such as in FIGS. 6 and 7. Semiconductor chips 24 having film adhesive 78 on the backsides thereof are placed on the individual pieces of film adhesive, similar to the process shown in FIG. 20. An advantage of providing both individual pieces of film adhesive 42 and film adhesive layer 78 is that the cure after bonding step 28 can often be eliminated. This type of die bonding process can be used with single-chip and multiple-chip semiconductor chip packages and can be used to secure both circuit-containing die and spacer die to underlying surfaces.

An advantage of semiconductor packaging process 34 of FIG. 5 over the paste-type process 10 of FIG. 1 is that wafer mounting tape lamination step 17 is not needed and also the expensive punching and cutting machines associated with lamination step 17 are avoided. What is more, since the paste dispensing process is unnecessary, time is saved and costs are reduced in proportion to the number of the semiconductor chip layers. In addition, multi-chip modules, fabricated using film adhesives, have advantages over multi-chip modules fabricated using paste adhesives because there is minimal or no tilt, no resin bleed, no fillet of adhesive encircling the semiconductor chip, and the height of the completed semiconductor chip package can be less because film adhesive layers are typically thinner than paste adhesive layers.

Figure 26:
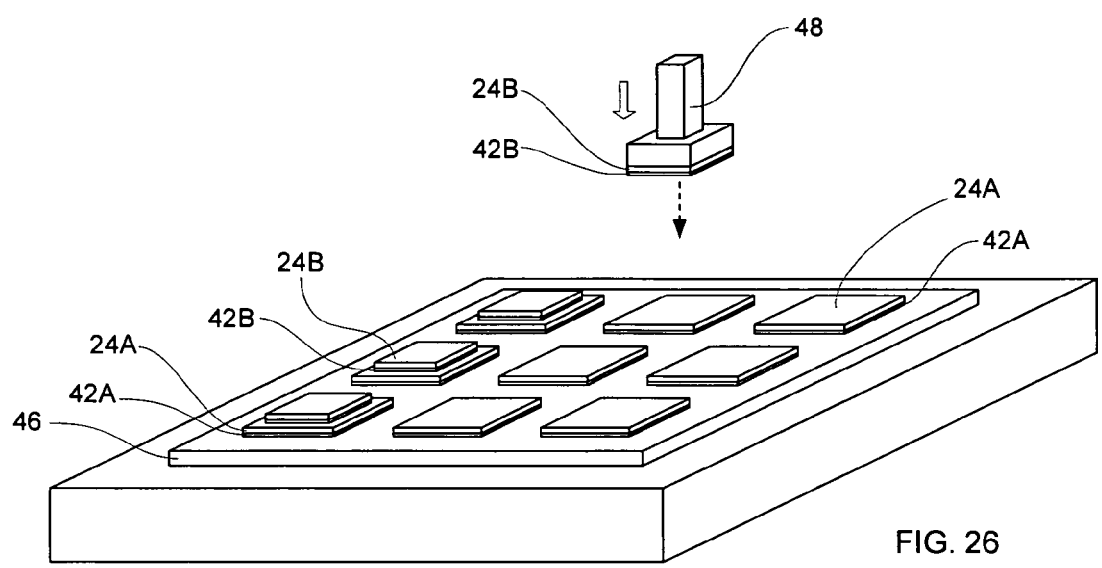
FIG. 26 illustrates stages in a process for making a multichip module as in FIG. 23 or FIG. 24, for example.

FIG. 26 illustrates stages in a process of making a stacked die package as in FIG. 23 according to the invention. In FIG. 26 adhesive film 42A and first die 24A have been placed on substrate 46, for example by steps as illustrated in FIGS. 5-8. Alternatively, adhesive film 42A and first die 24A may have been placed on substrate 46 by steps as illustrated for example in FIGS. 13-20. Then second die 24B with adhesive film 42B, constructed on a support by steps for example as illustrated in FIGS. 5-8, are placed upon first die 24A using a pick-and-place tool 48. Alternatively, individual adhesive film pieces 42B can be placed upon first die 24A using a pick-and-place tool, in a manner similar to that illustrated in FIG. 7; and then second die 24B can be placed upon the pre-placed adhesive film 42B using a pick-and place tool, in a manner similar to that illustrated in FIG. 8.

Figure 24:
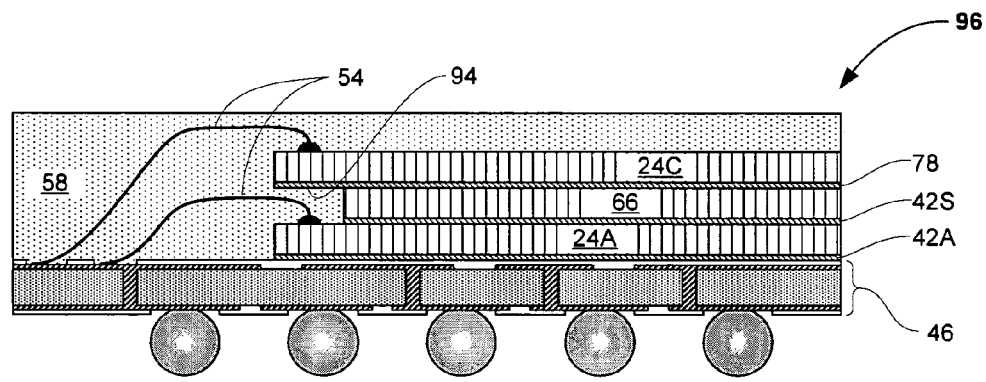

Referring to FIG. 24, the spacer 66 with adhesive film 42S can be stacked upon first die 24A by a process as illustrated in FIG. 26 for stacking second die 24B with adhesive film 42B upon first die 24A. Similarly, referring to FIG. 23, the spacer 66 with adhesive film 42S can be stacked upon second die 24B by a process as illustrated in FIG. 26 for stacking second die 24B with adhesive film 42B upon first die 24A.

The footprint of second die 24B is smaller than the footprint of first die 24A (FIG. 23), and the footprint of spacer 66 is smaller than the footprint of first die 24A (FIG. 24), so that a margin of first die 24A, on which the wire bond sites are situated, is not covered. Similarly the footprint of spacer 66 is smaller than the footprint of second die 24B (FIG. 23), so that a margin of second die 24B, on which the wire bond sites are situated, is not covered. It is not necessary that the spacer 66 or second die 24B be smaller in both width and length dimensions than the die over which it is stacked, as is shown by way of example in FIG. 26; it is sufficient that the second die 24B or spacer 66 be dimensioned to accommodate wire bond sites on the margin or margins of the die upon which it is stacked. For example, where the first die has wire bond sites on two opposite margins (as illustrated by way of example in FIG. 9), the die or spacer stacked over the first die need only be narrower in one dimension, and the die or spacer stacked over the first die can be the same size as the first die, or larger or smaller than the first die, in the other dimension.

In comparing the embodiments of FIGS. 23 and 24 to the embodiment of FIG. 12, it is apparent that insulated overhanging area 94 provides advantages over uninsulated overhanging area 68. However, in some situations it may be worthwhile to proceed with the embodiment of FIG. 12 instead of the embodiment of FIG. 24 because electrical isolation is not considered a problem and the existence of above-mentioned advantages of film adhesives.

Film adhesives offer certain advantages for die mounting. Particularly, for example, the film need not be cured immediately following the placement of the die, and so a cure step may be omitted from the process for each successive die that is mounted in stack. Also, typically die attach using curable paste adhesives results in "bleed-out" of the adhesive, which can result in contamination of wire bond sites on the die or substrate. Generally, however, because the die attach surface of the substrate may not be precisely planar, the adhesive employed in affixing a die to a substrate should be thick enough, and compliant enough at least at some stage in the mounting process to fill any voids between the lower surface of the die and the die attach surface of the substrate. Accordingly, in some applications a curable epoxy paste may be employed for the first die attach to the substrate, or, alternatively and preferably according to the invention, a thicker film adhesive or an adhesive laminate may be used for attachment of the lower die to the substrate, by steps outlined for example in FIGS. 5-8. Suitable adhesives include, for example, adhesives available from Hitachi designated in the "DF" series; and adhesives available from Sumitomo designated in the "IBF" series; and others As a practical matter, polymer films can absorb moisture, and thicker polymer films may absorb an unacceptable amount of moisture, and this imposes limitations on acceptable films for bottom die attach.

The surfaces of the die, on the other hand, are typically sufficiently planar to permit the use of relatively thin adhesive films for attachment of a die upon a previously mounted die. Suitable thin film adhesives include, for example, Lintec "LE5000"; Ablestik "RP 7873D"; Nitto adhesives designated in the "EM 100" series; and Sumitomo adhesives designated in the "IBF" series; and others.

Accordingly, according to the invention a thinner package results from employing a thin film adhesive for mounting die over die and, for example in the various FIGs., one or more of the adhesives 42B, 42S, and 78 preferably are thin film adhesives, and one or more of them may be affixed using steps according o the invention as shown for Example in FIGS. 5-8 and FIG. 26. Because the film 78 is larger than the die attach surface of the die (spacer) upon which the overlying die is stacked, the film 78 cannot be set by itself upon the die (spacer), and it must instead be affixed to the overlying die prior to attachment, preferably by steps according to the invention as shown in FIGS. 5-8, for example.

Other modification and variation can be made to the disclosed embodiments without departing from the subject of the invention as defined in following claims.

Any and all patents, patent applications and printed publications referred to above are incorporated by reference.

What is claimed is:

1. A semiconductor chip packaging method comprising:
   placing individual pieces of film adhesive on a support surface;
   individually placing diced semiconductor chips on the individual pieces of the film adhesive thereby securing the diced semiconductor chips to the support surface to create first chip subassemblies;
   electrically connecting the diced semiconductor chip and support surface of each of a plurality of the first chip subassemblies to create second chip subassemblies;
   encapsulating at least a portion of at least some of the second chip subassemblies to create semiconductor chip packages;
   selecting diced semiconductor chips having an adhesive layer on a back side thereof; and
   wherein the individually placing step comprises placing the diced semiconductor chips on the individual pieces of the film adhesive with the adhesive layer contacting the film adhesive.

2. The method according to claim 1 wherein selecting step is carried out with the adhesive layer comprising a dielectric film adhesive layer.

3. A semiconductor chip package made according to the method of claim 1.

4. A semiconductor chip package made according to the method of claim 2.

* * * * *